(12) United States Patent
Shiao et al.

(10) Patent No.: US 7,592,066 B2
(45) Date of Patent: Sep. 22, 2009

(54) ROOFING ARTICLES WITH REFLECTIVE THIN FILMS AND THE PROCESS OF PRODUCING THE SAME

(75) Inventors: Ming Liang Shiao, Collegeville, PA (US); Keith C. Hong, Lititz, PA (US)

(73) Assignee: CertainTeed Corporation, Valley Forge, PA (US)

( * ) Notice: Subject to any disclaimer, the term of this patent is extended or adjusted under 35 U.S.C. 154(b) by 303 days.

(21) Appl. No.: 11/163,103

(22) Filed: Oct. 5, 2005

(65) Prior Publication Data

US 2007/0077361 A1    Apr. 5, 2007

(51) Int. Cl.
*B32B 27/00* (2006.01)
*B32B 15/04* (2006.01)
*B05D 3/00* (2006.01)
*C23C 16/00* (2006.01)
*C23C 4/10* (2006.01)
*C23C 4/08* (2006.01)

(52) U.S. Cl. .................. 428/411.1; 428/421; 428/423.1; 428/425.8; 428/457; 428/461; 428/500; 427/248.1; 427/294; 427/421.1; 427/446; 427/453; 427/455

(58) Field of Classification Search .................. None
See application file for complete search history.

(56) References Cited

U.S. PATENT DOCUMENTS

| 2,732,311 | A | | 1/1956 | Hartwright | 427/186 |
|---|---|---|---|---|---|
| 4,038,239 | A | * | 7/1977 | Coyner et al. | 524/872 |
| 4,717,614 | A | | 1/1988 | Bondoc | 428/123 |
| 5,595,813 | A | * | 1/1997 | Ogawa et al. | 428/212 |
| 6,680,134 | B2 | | 1/2004 | Maurer et al. | 428/698 |
| 7,132,143 | B2 | | 11/2006 | Zanchetta et al. | |
| 2003/0068469 | A1 | | 4/2003 | Aschenbeck | 428/150 |
| 2003/0152747 | A1 | | 8/2003 | Fensel | 428/143 |
| 2005/0072110 | A1 | | 4/2005 | Shiao et al. | 52/741.1 |
| 2005/0072114 | A1 | | 4/2005 | Shiao et al. | 52/728.1 |
| 2006/0243388 | A1 | | 2/2006 | Kubiak et al. | |

* cited by examiner

*Primary Examiner*—Sheeba Ahmed
(74) *Attorney, Agent, or Firm*—Paul & Paul

(57) ABSTRACT

A roofing article is prepared by applying a thin metal or metal oxide film to a base substrate. The thin film has greater than about 80 percent transmission of incident radiation having a wavelength between 300 nm and 700 nm and greater that about 60 percent reflectance of incident radiation having a wavelength between 700 nm and 2500 nm.

28 Claims, 1 Drawing Sheet

ROOFING ARTICLES WITH REFLECTIVE THIN FILMS AND THE PROCESS OF PRODUCING THE SAME

BACKGROUND OF THE INVENTION

1. Field of the Invention

The present invention relates to asphalt roofing shingles, and protective granules for such shingles, and processes for makings such granules and shingles.

2. Brief Description of the Prior Art

Mineral surfaced asphalt shingles, such as those described in ASTM D225 ("Standard Specification for Asphalt Shingles (Organic Felt) Surfaced with Mineral Granules") or D3462 ("Standard Specification for Asphalt Shingles Made From Glass Felt and Surfaced with Mineral Granules"), are generally used on steep-sloped roofs to provide water-shedding function while adding an aesthetically pleasing appearance to the roofs. The asphalt shingles are generally constructed from asphalt-saturated roofing felts and surfaced by pigmented color granules, such as those described in U.S. Pat. No. 4,717, 614. Pigment-coated mineral rocks are commonly used as color granules in roofing applications to provide aesthetic as well as protective functions to the asphalt shingles. Roofing granules are generally used in asphalt shingle or in roofing membranes to protect asphalt from harmful ultraviolet radiation.

Roofing granules typically comprise crushed and screened mineral materials, which are subsequently coated with a binder containing one or more coloring pigments, such as suitable metal oxides. The granules are employed to provide a protective layer on asphaltic roofing materials such as shingles, and to add aesthetic values to a roof.

In the past, pigments for roofing granules have usually been selected to provide shingles having an attractive appearance with little thought to the thermal stresses encountered on shingled roofs. However, depending on location and climate, shingled roofs can experience very challenging environmental conditions, which tend to reduce the effective service life of such roofs. One significant environmental stress is the elevated temperature experienced by roofing shingles under sunny, summer conditions, especially roofing shingles coated with dark colored roofing granules.

Conventional asphalt shingles are known to have low solar heat reflectance, and hence will absorb solar heat especially through the near infrared range (700 nm-2500 nm) of the solar spectrum. This phenomenon is increased as the granules covering the surface become dark in color. For example, while white-colored asphalt shingles can have solar reflectance in the range of 25-35%, dark-colored asphalt shingles can have solar reflectance of only 5-15%. Furthermore, except in the white or very light colors, there is typically only a very small amount of pigment in the conventional granule's color coating that reflects solar radiation well. As a result, it is common to measure temperatures as high as 77° C. on the surface of black roofing shingles on a sunny day with 21° C. ambient temperature. Absorption of solar heat may result in elevated temperatures at the shingle's surroundings, which can contribute to the so-called heat-island effects and increase the cooling load to its surroundings or energy consumption needs for air conditioning.

This heat absorption problem has been addressed by applying white pigment-containing latex coatings directly onto the shingle surface on the roof. Although such roofs can be coated with solar reflective paint or coating material, such as a composition containing a significant amount of titanium dioxide pigment, in order to reduce such thermal stresses, this utilitarian approach will often prove to be aesthetically undesirable, especially for residential roofs. Another approach is provided by U.S. Pat. No. 2,732,311, which discloses a method for preparing roofing granules having metal flakes, such as aluminum flakes, adhered to their surfaces, to provide a radiation-reflective surface. Additionally, the use of exterior-grade coatings colored by infrared-reflective pigments for deep-tone colors, and sprayed onto the roof in the field, has been proposed. Employing another approach, U.S. Patent Publication 2003/0068469 A1 discloses an asphalt-based roofing material comprising mat saturated with asphalt coating and a top coating having a top surface layer that has a solar reflectance of at least 70%. The high reflectance of the top surface layer is achieved by embedding metal flakes or a reflective pigment such as titanium dioxide or zinc sulfide in surface layer (paragraph 48). Alternatively, minerals with high solar reflectance can be selected and employed as roofing granules. For example, U.S. Patent Publication 2003/ 0152747 A1 discloses the use of granules with solar reflectance greater than 55% to enhance the solar reflectivity of asphalt based roofing products. U.S. Patent Publication 2005/ 0072114 A1 discloses solar-reflective roofing granules having deep-tone colors are formed by coating base mineral particles with a coating composition including an infrared-reflective pigment. Color is provided by colored infrared pigment, light-interference platelet pigment, or a metal oxide. U.S. Patent Publication 2005/0072110 A1 discloses an infrared-reflective material applied directly to the bituminous surface of a roofing product to increase the solar heat reflectance of the product, even when deep-tone roofing granules are used to color the product. The infrared-reflective material can be applied as a powder or in a carrier fluid or film, and can be applied along with infrared-reflective roofing granules.

Thin metal films with thickness ranging from several Angstroms to the order of 100 Angstrom are known to have transparency in the visible light spectrum yet be reflective in the near infrared ("NIR") or infrared ("IR") range, such as disclosed, for example, in U.S. Pat. NO. 6,680,134. Such thin metal films have been used in architectural glasses or specialty windows to reflect heat in the NIR or IR ranges.

There is a continuing need for roofing materials, and especially asphalt shingles, that have improved resistance to thermal stresses while providing an attractive appearance. In particular, there is a need for increased solar heat reflectance to reduce the solar absorption of the shingle, while maintaining the aesthetic values of the system.

SUMMARY OF THE INVENTION

The present invention provides a process for preparing a roofing article, such as a shingle or roofing sheet. The present invention also provides roofing articles or materials that have improved resistance to thermal stresses which simultaneously provide an attractive appearance. The process employs a base substrate having an upper surface, to which a thin film is applied. The thin film is selected from the group consisting of metals and metal oxides and has a thickness selected to transmit greater than about 80 percent of incident radiation having a wavelength between 300 nm and 700 nm and reflect greater than about 60 percent incident radiation having a wavelength between 700 nm and 2500 nm. Preferably, the thin film has a thickness of from about 5 Angstroms to at least about 200 Angstroms.

Preferably, the thin film is selected to provide a colored roofing article having an L* less than 85, more preferably less than 55, with an L* less than about 45 being especially preferred.

Preferably, the thin film is applied by an application process selected from the group consisting of atmospheric plasma deposition, plasma-assisted polymerization, chemical vapor deposition, physical vapor deposition, sputtering, casting, coating, laminating, electroplating, electroless plating, and thermal spraying. Preferably, the application process is selected from the group consisting of atmospheric plasma deposition, plasma-assisted polymerization, and physical vapor deposition.

Preferably the thin film comprises a material selected from the group consisting of silver, aluminum, copper, zinc, tin, gold, palladium, nickel, and alloys thereof. The thin film can comprise an alloy of silver and copper, an alloy of gold and palladium, etc.

In another aspect of the present invention, the thin film preferably comprises a material selected from the group consisting of titanium oxides, zinc oxides, and tin oxides.

In one aspect of the process of the present invention, a clear coating is applied over the thin film to protect the thin film. Preferably, the clear coating is applied by a method selected from the group consisting of spraying, electrostatic spraying, sonic spraying, inkjet printing, gravure printing, roll coating, and extrusion coating. Preferably, the clear coating is selected from the group consisting of poly(meth)acrylates, polyurethanes, fluoropolymers, phosphates, titanates, zirconates, silicates, and silicas.

Preferably, the upper surface of the base substrate is prepared for application of the thin film; preferably, by cleaning. Preferably, the base substrate is cleaned by a process selected from the group consisting of atmospheric pressure plasma cleaning, corona treating, solvent washing, detergent washing, soap washing, high pressure washing, and steam cleaning.

Preferably, the base substrate is selected from the group consisting of sheets, tiles, shakes, shingles and membranes. More preferably, the base substrate is selected from the group consisting of asphalt shingles, roofing membranes, ceramic roofing tiles, painted metal coil stock, anodized or non-anodized metal shakes, concrete roofing tiles, cedar shakes, natural slate roofing tiles, and synthetic slate roofing tiles.

In one aspect of the process of the present invention, the thin film comprises a plurality of layers.

In another aspect of the process of the present invention, the base sheet comprises a film material, and the thin film is applied to the film material to form a composite. In this aspect, the process further comprises laminating the composite to a roofing article selected from the group consisting of asphalt shingles, roofing membranes, ceramic roofing tiles, painted metal coil stock, anodized or non-anodized metal shakes, concrete roofing tiles, cedar shakes, natural slate roofing tiles, and synthetic roofing tiles.

The present invention also provides a roofing article that is comprised of a base substrate, which has an upper surface that is coated with a thin film. The thin film is preferably selected from the group consisting of metals and metal oxides and transmits greater than about 80 percent of incident radiation having a wavelength between 300 nm and 700 nm and reflects greater than about 60 percent incident radiation having a wavelength between 700 nm and 2500 nm. Preferably, the thin film has a thickness of from about 5 Angstroms to at least about 200 Angstroms.

Preferably, in one embodiment of the article of the present invention, the thin film is selected to provide a colored roofing article having an L* less than 85, more preferably less than 55, with an L* less than about 45 being especially preferred.

Preferably, the thin film is a material selected from the group consisting of silver, aluminum, copper, zinc, tin, gold, palladium, nickel, and alloys thereof, with an alloy of gold and palladium being especially preferred.

Preferably, the thin film comprises a material selected from the group consisting of titanium oxides, zinc oxides, and tin oxides.

In one aspect of the roofing article of the present invention, the roofing article further comprises a clear coating over the thin film, with the clear coating preferably being selected from the group consisting of poly(meth)acrylates, polyurethanes, fluoropolymers, phosphates, titanates, zirconates, silicates, and silicas.

Preferably, the roofing article includes a base substrate selected from the group consisting of asphalt shingles, roofing membranes, ceramic roofing tiles, painted metal coil stock, metal shakes, concrete roofing tiles, cedar shakes, natural slate roofing tiles, and synthetic slate roofing tiles.

In another aspect of the roofing article of the present invention, the thin film comprises a plurality of layers.

In another aspect, the roofing article according to the present invention includes a base substrate comprising a film material, with the thin film being applied to the film material to form a composite, and the composite being laminated to a base article selected from the group consisting of asphalt shingles, roofing membranes, ceramic roofing tiles, painted metal coil stock, metal shakes, concrete roofing tiles, cedar shakes, natural slate roofing tiles, and synthetic slate roofing tiles.

DETAILED DESCRIPTION

Figure 1:
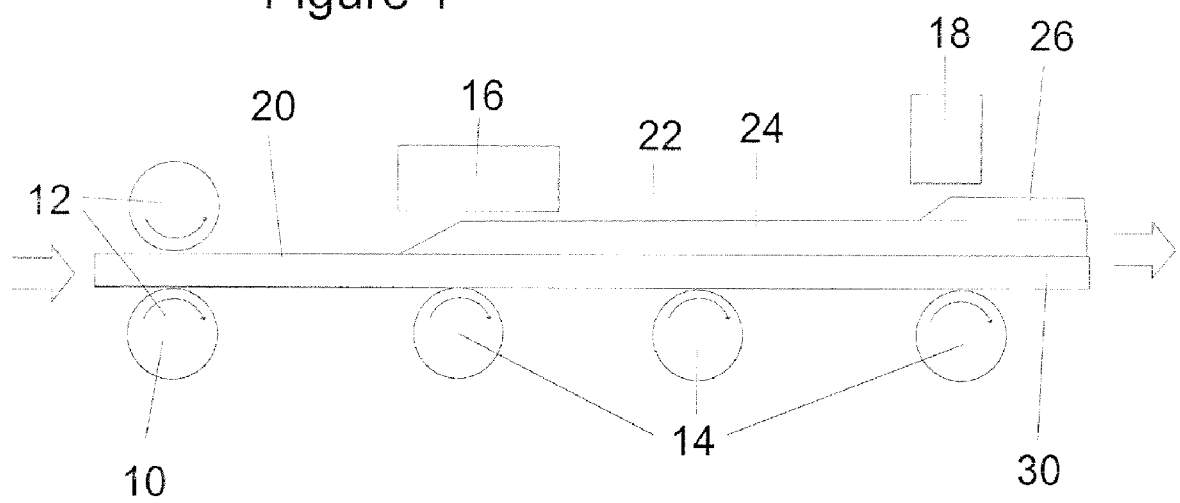
FIG. 1 is a schematic illustration of a process for producing a roofing article according to the present invention.

The present invention provides the roofing articles with increased solar heat reflection. The improved solar heat reflection is attained by depositing a thin metal or metal oxide film on the surface of the roofing article. The film is thick enough to provide improved solar heat reflection, while being sufficiently thin to maintain the desired color of the roofing article. Preferably, the thickness of the thin metal or metal oxide film ranges from several Angstroms to the order of 200 Angstroms, such that the thin film has adequate transparency in the visible light spectrum yet is effectively reflective in the near infrared (NIA) or infrared (IA) range. Roofing articles including such a thin metal film can have good solar heat reflectivity, yet retain desired colors because the thin film is sufficiently transparent in the visible light spectrum.

As used in the present specification, L* is measured using a Hunter Lab Model Labscan XE spectrophotometer, available from Hunter Associates Laboratory, Reston, Va., using a 0 degree viewing angle, a 45 degree illumination angle, a 10 degree standard observer, and a D-65 illuminant.

Referring now to the FIGURE, there is shown in FIG. 1, a schematic illustration of a continuous process for producing roofing articles according to the present invention. A clean base substrate 20, comprising a web of roofing material, such as, for example, a web from which asphalt shingles will be subsequently cut, is transported in the direction of the arrow by feed rollers 10, 12. The base substrate 20 comprises a conventional roofing material, namely a glass fiber-reinforced bituminous web coated on the upper side with colored roofing granules. The base substrate 20 is carried by several transport rollers 14 to a thin film deposition station 16, at which a thin film of metal 22 is deposited on the top of the base substrate 20. Subsequently, the thin film-coated base substrate 24 is transported to a clear film application station 18 at which a protective clear film 26 is deposited on top of the thin metal film 22. The resulting roofing product is subsequently cut into shingles and packaged (not shown).

In the alternative, a batch process can be employed. For example, the thin metal or metal oxide film can be directly applied to otherwise finished roofing products, such as roofing shingles, by a batch process. In another example, the thin metal or metal oxide film can be applied to an individual shake, shingle, tile or the like.

In the process of the present invention, various means can be employed to place or deposit a thin metal film on the surface of a roofing article, such as plasma deposition, atmospheric vapor deposition, polymer-assisted polymerization, chemical vapor deposition, physical vapor deposition, sputtering, casting, coating, lamination, electroplating, electroless plating, thermal spraying, et al. Atmospheric plasma deposition, plasma-assisted polymerization, polymer-assisted deposition, chemical vapor deposition, and physical vapor deposition are presently preferred.

Preferably, the thin metal or metal oxide film has greater than about 80 percent transmission of incident radiation having a wavelength between 300 nm and 700 nm and greater than about 60 percent reflectance of incident radiation having a wavelength between 700 nm and 2500 nm.

Preferably, the thin metal or metal oxide film is deposited to a thickness of from about 5 Angstroms to about 100 Angstroms.

Preferably, the thin metal or metal oxide film has good transparency in the visible spectrum, so that colored, solar reflective roofing articles can be prepared. Preferably, the thin metal or metal oxide film is selected to provide a colored roofing article having an L* of less than 85, more preferably to provide an L* of less than 55, and still more preferably to provide an L* of less than 45. If desired, the thin metal film or metal oxide can be selected to provide a desired color or color effect, or otherwise modify the aesthetic appearance of such roofing article compared to one lacking the thin metal or metal oxide film.

For the deposition of the thin film, processes that provide deposition at atmospheric pressure are presently preferred, such as plasma deposition or vapor deposition. If a vacuum or low pressure is required or desirable to facilitate the deposition process, a continuous/batch or batch process under vacuum can be employed to prepare such film.

Alternatively, a weatherable film that has a pre-deposited thin metal or metal oxide film surface with the desirable optical properties can be laminated directly onto the base substrate. Such lamination may optionally include an adhesive layer, tie layer, or surface treatment of the base substrate, or a combination thereof.

Suitable base substrates include, but are not limited to, asphalt shingles in the traditional web process, roofing membranes, roofing tiles, painted metal coils, metal shakes, ceramic roofing tiles, concrete roofing tiles, wood shakes such as cedar shakes, natural slate roofing tiles, and synthetic slate roofing tiles.

Preparation of the base substrate for application of the thin metal or metal oxide film depends upon the method of film application chosen. In most cases, excess granules and foreign matter are preferably removed prior to treatment. Suitable cleaning methods include, but are not limited to, atmospheric pressure plasma cleaning, solvent washing, soap/detergent washing, high-pressure washing, and steam cleaning.

The application of thin metal and metal oxide films to certain other types of substrates, such as glass substrates, is well known in the art. Suitable thin metal or metal oxide films include thin films of silver, aluminum, copper, zinc, tin, gold, palladium, metal alloys, titanium dioxide, zinc oxide, and tin oxide.

While a single layer of metal or metal oxide can be applied, multiple layers can also be applied, to build up the metal or metal oxide layer to a desired thickness to achieve a desirable balance of color transparency and NIR reflectance. When multiple layers are used, the compositions of the layers may be the same or they may vary from layer to layer, a layer or layers having gradients in composition through a given layer may also be employed.

Optionally, the thin metal or metal oxide film can be selected to provide additional desirable properties to the roofing article. For example, the thin metal or metal oxide film can be selected to provide algaecidal effects, photo-catalytic effects for self-cleaning applications, surface hydrophobic effects, spectrogoniophotometric effects, or metallic visual effects.

An optional clear coating can be applied over the thin metal or metal oxide film to retard degradation of the thin metal or metal oxide film and to prolong its durability for roofing applications. Suitable clear protective coatings include poly (meth)acrylates, polyurethanes, fluoropolymers, phosphates, titanates, zirconates, silicates such as metal silicates, and silicas. Clear protective coatings can be applied by methods such as spraying, sonic spraying, ink jet printing, roll coating, and extrusion coating.

Bituminous roofing products used as base sheets in the process of the present invention are typically manufactured in continuous processes in which a continuous substrate sheet of a fibrous material such as a continuous felt sheet or glass fiber mat is immersed in a bath of hot, fluid bituminous coating material so that the bituminous material saturates the substrate sheet and coats at least one side of the substrate. The reverse side of the substrate sheet can be coated with an anti-stick material such as a suitable mineral powder or a fine sand. Roofing granules are then distributed over selected portions of the top of the sheet, and the bituminous material serves as an adhesive to bind the roofing granules to the sheet when the bituminous material has cooled. The sheet can then be cut into conventional shingle sizes and shapes (such as one foot by three feet rectangles), slots can be cut in the shingles to provide a plurality of "tabs" for ease of installation, additional bituminous adhesive can be applied in strategic locations and covered with release paper to provide for securing successive courses of shingles during roof installation, and the finished shingles can be packaged. More complex methods of shingle construction can also be employed, such as building up multiple layers of sheets in selected portions of the shingle to provide an enhanced visual appearance, or to simulate other types of roofing products. Alternatively, the sheets can be formed into membranes or roll goods for commercial or industrial roofing applications.

The bituminous material used in manufacturing roofing products is typically derived from a petroleum-processing by-product such as pitch, "straight-run" bitumen, or "blown" bitumen. The bituminous material can be modified with extender materials such as oils, petroleum extracts, and/or petroleum residues. The bituminous material can include various modifying ingredients such as polymeric materials, such as SBS (styrene-butadiene-styrene) block copolymers, resins, flame-retardant materials, oils, stabilizing materials, anti-static compounds, and the like. Preferably, the total amount by weight of such modifying ingredients is not more than about 15 percent of the total weight of the bituminous material. The bituminous material can also include amorphous polyolefins, up to about 25 percent by weight. Examples of suitable amorphous polyolefins include atactic polypropylene, ethylene-propylene rubber, etc. Preferably, the amorphous polyolefins employed have a softening point of from about 130 degrees C. to about 160 degrees C. The bituminous composition can also include a suitable filler, such as calcium carbonate, talc, carbon black, stone dust, or fly ash, preferably in an amount from about 10 percent to 70 percent by weight of the bituminous composite material.

The following example is provided to better disclose and teach processes and compositions of the present invention. It is for illustrative purposes only, and it must be acknowledged that minor variations and changes can be made without materially affecting the spirit and scope of the invention as recited in the claims that follow.

EXAMPLES

A thin metal film was deposited onto an asphalt shingle surface using the sputtering technique by using a gold/palladium target. The surface of asphalt shingle with black roofing granules was first cleaned using soap and water to remove surface oil and dust. After drying in the room conditions, the surface of the sample was then coated by AuPd film under 200 millitorr vacuum followed by low pressure argon for various thicknesses.

The results provided in Table 1 show the estimated thickness of the deposited thin film and the resultant film performance in their color transparency and their solar reflectance. The film provides adequate color transparent with increased solar reflectance when the thickness is less than 120 Angstrom for the AuPd film.

TABLE 1

| Sample No. | Film Thickness, Angstroms | $L^*$ | Hunter Lab Color Reading $a^*$ | $b^*$ | % Solar Reflectance |
|---|---|---|---|---|---|
| Comp. Ex. 1 | 0 | 28.66 | −0.58 | −0.39 | 5.3 |
| Example 1 | 66 | 30.76 | −0.24 | −0.12 | 6.3 |
| Comp. Ex. 2 | 0 | 27.84 | −0.50 | −0.21 | 4.6 |
| Example 2 | 83 | 31.41 | −0.11 | 0.04 | 6.7 |
| Comp. Ex. 3 | 0 | 28.13 | −0.50 | 0.04 | 5.2 |
| Example 3 | 100 | 32.45 | −0.12 | 009 | 7.0 |
| Comp. Ex. 4 | 0 | 26.82 | −0.44 | −019 | 5.0 |
| Example 4 | 117 | 33.33 | −0.01 | 0.01 | 7.4 |
| Comp. Ex. 5 | 0 | 30.14 | −0.64 | −0.29 | 6.0 |
| Example 5 | 166 | 37.48 | 0.02 | 0.30 | 9.5 |

Various modifications can be made in the details of the various embodiments of the processes, compositions and articles of the present invention, all within the scope and spirit of the invention and defined by the appended claims.

What is claimed is:

1. A process for preparing a roofing article, the process comprising:
   (a) providing a base substrate having an upper surface;
   (b) applying a thin film to the upper surface of the base substrate, the thin film being selected from the group consisting of metals and metal oxides having greater than about 80 percent transmission of incident radiation having a wavelength between 300 nm and 700 nm and greater than about 60 percent reflectance of incident radiation having a wavelength between 700 nm and 2500 nm, and
   (c) applying a clear coating over the thin film, the clear coating being selected from the group consisting of poly (meth)acrylates, polyurethanes, fluoropolymers, phosphates, titanates, zirconates, silicates, and silicas.

2. A process according to claim 1 wherein the thin film has a thickness of from about 5 Angstroms to about 200 Angstroms.

3. A process according to claim 1 wherein the thin film is selected to provide a colored roofing article having an $L^*$ of less than 85.

4. A process according to claim 3 wherein the thin film is selected to provide a colored roofing article having an $L^*$ of less than 55.

5. A process according to claim 4 wherein the thin film is selected to provide a colored roofing article have an $L^*$ of less than about 45.

6. A process according to claim 1 wherein the thin film is applied by an application process selected from the group consisting of atmospheric plasma deposition, plasma-assisted polymerization, chemical vapor deposition, physical vapor deposition, sputtering, casting, coating, laminating, electroplating, electroless plating, and thermal spraying.

7. A process according to claim 6 wherein the application process is selected from the group consisting of atmospheric plasma deposition, plasma-assisted polymerization, and physical vapor deposition.

8. A process according to claim 1 wherein the thin film comprises a material selected from the group consisting of silver, aluminum, copper, zinc, tin, gold, palladium, nickel, and alloys thereof.

9. A process according to claim 1 wherein the thin film comprises a material selected from the group consisting of titanium oxides, zinc oxides, and tin oxides.

10. A process according to claim 1 wherein the clear coating is applied by a method selected from the group consisting of spraying, electrostatic spraying, sonic spraying, ink jet printing, gravure printing, roll coating, and extrusion coating.

11. A process according to claim 1 further comprising preparing the upper surface of the base substrate for application of the thin film.

12. A process according to claim 11 wherein preparing the upper surface of the base substrate for application of the thin film comprises cleaning the base substrate.

13. A process according to claim 12 wherein the base substrate is cleaned by a process selected from the group consisting of atmospheric pressure plasma cleaning, solvent washing, detergent washing, soap washing, high pressure washing, and steam cleaning.

14. A process according to claim 1 wherein the base substrate is selected from the group consisting of sheets, tiles, shakes, shingles and membranes.

15. A process according to claim 1 wherein the base substrate is selected from the group consisting of asphalt shingles, roofing membranes, ceramic roofing tiles, painted metal coil stock, metal shakes, concrete roofing tiles, cedar shakes, natural slate roofing tiles, and synthetic slate roofing tiles.

16. A process according to claim 1 wherein the thin film comprises a plurality of layers.

17. A process according to claim 1 wherein the base substrate comprises a film material and the thin film is applied to the film material to form a composite, and further comprising laminating the composite to a roofing article selected from the group consisting of asphalt shingles, roofing membranes, ceramic roofing tiles, painted metal coil stock, metal shakes, concrete roofing tiles, cedar shakes, natural slate roofing tiles, and synthetic slate roofing tiles.

18. A roofing article comprising a base substrate having an upper surface, the upper surface being coated with a thin film selected from the group consisting of metals and metal oxides having greater than about 80 percent transmission of incident radiation having a wavelength between 300 nm and 700 nm and greater that about 60 percent reflectance of incident radiation having a wavelength between 700 nm and 2500 nm, the thin film being covered with a clear coating selected from the group consisting of poly(meth)acrylates, polyurethanes, fluoropolymers, phosphates, titanates, zirconates, silicates, and silicas.

19. A roofing article according to claim 18 wherein the thin film has a thickness of less than about 120 Angstroms.

20. A roofing article according to claim 18 wherein the thin film is selected to provide a colored roofing article having an L* of less than 85.

21. A roofing article according to claim 20 wherein the thin film is selected to provide a colored roofing article having an L* of less than about 55.

22. A roofing article according to claim 21 wherein the thin film is selected to provide a colored roofing article have an L* of less than about 45.

23. A roofing article according to claim 18 wherein the thin film comprises a material selected from the group consisting of silver, aluminum, copper, zinc, tin, gold, palladium, nickel and alloys thereof.

24. A roofing article according to claim 18 wherein the thin film comprises a material selected from the group consisting of titanium oxides, zinc oxides, and tin oxides.

25. A roofing article according to claim 18 wherein the base substrate is selected from the group consisting of asphalt shingles, roofing membranes, ceramic roofing tiles, painted metal coil stock, concrete roofing tiles, cedar shakes, natural slate roofing tiles, and synthetic slate roofing tiles.

26. A roofing article according to claim 18 wherein the thin film comprises a plurality of layers.

27. A roofing article according to claim 18 wherein the base substrate comprises a film material, the thin film being applied to the film material to form a composite, the composite being laminated to a base article selected from the group consisting of asphalt shingles, roofing membranes, ceramic roofing tiles, painted metal coil stock, metal shakes, concrete roofing tiles, cedar shakes, natural slate roofing tiles, and synthetic slate roofing tiles.

28. A roofing article comprising a base substrate having an upper surface, the base substrate being selected from the group consisting of asphalt shingles, roofing membranes, ceramic roofing tiles, painted metal coil stock, concrete roofing tiles, cedar shakes, natural slate roofing tiles, and synthetic slate roofing tiles, the upper surface being coated with a thin film selected from the group consisting of metals and metal oxides having greater than about 80 percent transmission of incident radiation having a wavelength between 300 nm and 700 nm and greater that about 60 percent reflectance of incident radiation having a wavelength between 700 nm and 2500 nm, the thin film being selected to provide a colored roofing article having an L* of less than 85.

* * * * *